United States Patent [19]

Carver

[11] 4,218,660
[45] Aug. 19, 1980

[54] AUDIO AMPLIFIER AND METHOD OF OPERATING THE SAME

[76] Inventor: Robert W. Carver, 6101 - 14th Pl. SW., Edmonds, Wash. 98020

[21] Appl. No.: 958,141

[22] Filed: Nov. 6, 1978

[51] Int. Cl.² .......................... H03F 3/21; H03F 3/26
[52] U.S. Cl. .................................... 330/297; 330/263
[58] Field of Search ............ 330/10, 202, 203, 207 A, 330/251, 297, 263

[56] References Cited

U.S. PATENT DOCUMENTS

| | | | |
|---|---|---|---|
| 3,319,175 | 5/1967 | Dryden | 330/297 |
| 3,396,326 | 8/1968 | Kisrow | 323/9 |
| 3,426,290 | 2/1969 | Jensen | 330/297 |
| 3,564,393 | 2/1971 | Williamson | 323/17 |
| 3,581,187 | 5/1971 | Grady | 323/17 |
| 3,585,517 | 6/1971 | Herbert | 330/297 |
| 3,740,640 | 6/1973 | Ravas | 323/17 |
| 3,745,443 | 7/1973 | Weil | 323/17 X |
| 3,772,606 | 11/1973 | Waehner | 330/267 |
| 3,863,140 | 1/1975 | Easter et al. | 323/17 |
| 3,873,903 | 3/1975 | Kuetsch et al. | 321/2 |
| 3,931,567 | 1/1976 | Kostecki | 323/9 |
| 3,961,280 | 6/1976 | Sampei | 330/267 |
| 4,054,843 | 10/1977 | Hamada | 330/263 |

*Primary Examiner*—James B. Mullins
*Attorney, Agent, or Firm*—Hughes & Barnard, Inc.

[57] ABSTRACT

A power transformer connected to an amplifier, said transformer being adapted to operate at maximum power output at a relatively high frequency, in the order of 20 KHz. There is a control circuit which produces control pulses at a frequency of 20 KHz. The voltage level at the output of the transformer is compared to the amplitude of the audio signal to be amplified to produce a control signal related to the difference between the two. This control signal acts through a modulator to pass portions of each control pulse, with the duration of the pulse portions that are passed being generally proportional to the magnitude of the control signal. These pulse portions in turn open and close a switch connected to the primary winding of the transformer to control the duration of current pulses which flow through the transformer at a 20 KHz frequency. When the power requirements of the amplifier are either higher or lower, the duration of the current pulses to the transformer are made longer or shorter, respectively, to match the power requirements of the amplifier.

50 Claims, 12 Drawing Figures

AUDIO AMPLIFIER AND METHOD OF OPERATING THE SAME

BACKGROUND OF THE INVENTION

Historically, high quality, high power, power amplifiers, used for home high-fidelity reproduction have been large, heavy and expensive. For example, a typical 400 watt amplifier weighs anywhere from 35 lbs. to over 85 lbs. depending upon the particular design and choice of materials. Such prior art power amplifiers are heavy for two reasons. First, they require a power transformer that makes up about 60% of the weight of the total amplifier. Second, they require heat sinks which make up about 25% of the total weight. Thus, about 85% of the amplifier's weight is contributed by the power transformer and the heat sinks.

Another consideration is that the power which is dissipated in the heat sinks represents wasted power. In a typical prior art power amplifier the efficiency generally averages around 50%, with the efficiency being higher when the amplifier is reproducing signals of a larger magnitude, and the efficiency being quite small when signals of small magnitude are being amplified.

This latter problem has been recognized in the prior art, and a number of patents relating to audio amplifiers disclose devices which have for their object the purpose of limiting the voltage supply to the power input terminals to the amplifier itself to avoid wasting current. For example, in U.S. Pat. No. 3,426,290, Jensen, there is a control circuit in series between the output terminals of a power transformer and the load, which is the amplifier itself. A control signal is derived from the audio input signal, and this controls a transistor in series between the output of the transformer and the amplifier to turn the transistor on and off to chop up the current which goes to the load. This arrangement requires a series connected inductance coil and a shunt capacitor between the load and the control transistor. A later patent, U.S. Pat. No. 4,054,843, Hamada, operates in essentially the same way.

Another approach to this same general problem of improving efficiency in audio amplifiers is shown in U.S. Pat. No. 3,319,175, Dryden, which discloses a device which supplies a varying voltage to the amplifier. However, the voltage changes in increments, and this is accomplished by placing multiple tabs on the output side of the power transformer. A control signal is derived from the audio signal to tap various parts of the transformer as needed to increase or decrease the voltage applied to the amplifier. Similar devices are disclosed in U.S. Pat. No. 3,772,606, Waehner, and in U.S. Pat. No. 3,961,280, Sampei.

U.S. Pat. No. 3,585,517, Herbert, also relates to a power amplifier. This patent discloses a device which converts an audio signal to a series of pulses, the amplitude of which is proportional to the input signal. These pulses are then reconstructed back into an audio signal in the amplifier.

A number of other patents were disclosed in a search of the patent literature. These are not considered relevant to the present invention, but are disclosed herein mainly to insure that the applicant is complying with his duty of making a full disclosure of anything which might be considered relevant as prior art. These following patents relate to controlling the voltage of a power source, with the voltage being related to some absolute steady reference voltage to provide a constant voltage to the load. These patents are as follows: U.S. Pat. Nos. 3,396,326, Kisrow; 3,564,393, Williamson; 3,581,187, Grady Jr.; 3,740,640, Ravas; 3,745,443, Weil; 3,863,140, Easter et al; 3,873,903, Koetsch et al; 3,931,567, Kostecki.

SUMMARY OF THE INVENTION

The apparatus of the present invention is arranged to amplify a signal, such as an audio signal, having amplitude variations. The apparatus comprises amplifier means having power input means, signal input means, and output means.

There is power means comprising a transformer having a primary winding and a secondary winding, the secondary winding being operatibely connected to the power input means of the amplifier means. The primary winding is adaped to be connected to a voltage source.

There is means to cause current pulses to be transmitted to the primary winding of the transformer, and circuit means responsive to the signal in a manner to control the power of the pulses transmitted to the primary winding. This is done so as to increase and decrease power of the pulses as the signal increases and decreases in amplitude, so that the power means provides to the amplifier means power of a magnitude related to power requirements of the amplifier means to provide an output corresponding to the signal.

In the preferred form, the circuit means further comprises switch means operatively connected to the primary winding of the transformer to interrupt current to the primary winding. There are other means to make the switch means non-conductive at periodic intervals to cause the current pulses to flow through the transformer.

The circuit means further comprises modulating means to control the power of the current pulses to the transformer primary winding. This is desirably done by controlling the duration of open periods of the switch means in a manner that pulses of shorter duration pass through the primary winding when the amplitude of the signal is relatively small, and pulses of greater duration are delivered through the primary winding of the transformer when the amplitude of the signal is relatively large.

There is comparator means responsive to a first value related to amplitude of the signal and to a second value related to power then available from the transformer for the amplifier means. The comparator is arranged to provide a control signal of a value related to a difference between the first and second values to provide an output of a magnitude corresponding generally to the amplitude of the signal. The first value is a voltage, the magnitude of which increases and decreases with the amplitude of the signal. The second value is a voltage related to the voltage at an output end of said transformer.

Desirably, there is an absolute value detector arranged to receive the signal and produce a direct current output having a magnitude related to the amplitude of the signal. The absolute value detector means is arranged to transmit its direct current output to the comparitor as said first value.

Preferably, there is a non-linear peak detector arranged to receive the direct current voltage from the absolute value detector and produce an output voltage for the comparator. The output voltage of the non-linear peak detector corresponds to the output from the absolute value detector. The nonlinear peak detector is more responsive to larger rapid variations in amplitude in the signal and less responsive to relatively small variations in amplitude of the signal.

There are other comparing means operatively connected to two ends of the secondary winding of the transformer to produce a summing value related to a difference in absolute magnitude of the voltages at the ends of the transformer secondary winding. This other comparing means is arranged to produce a second control voltage related to the summing value. The comparator means and the other comparing means are arranged to transmit a control output which is responsive to relative magnitude of the first control output signal from the comparator and the second control signal from the other comparing means. The output is arranged to control power of current pulses in the primary winding of the transformer.

In the preferred form, the comparing means is so arranged that the secondary winding of the transformer has a middle portion thereof connected to a reference voltage, in a manner that one end of the secondary winding is positive and the other end of the second winding is negative, relative to the reference voltage. The other comparing means is operatively connected to the reference voltage to compare the reference voltage to the summing value to produce the second output control signal.

Specifically, the other comparing means comprises an amplifier having two input terminals and an output terminal. A first resistor is connected to one end of the secondary winding, with the first and second resistors being connected at a summing junction. The summing junction is connected through a first diode, which blocks positive current, to one of the input junctions of the amplifier, and also being connected through a second diode, which blocks negative current, to the second input junction of the transformer. The output terminal of the amplifier is operatively connected to the output from the comparator.

The circuit further comprises pulsing means to provide control pulses, each having a voltage which varies between a lower and higher level as a function of time of each control pulse. There is modulating means to pass portions of the control pulses to control duration of the current pulses through the primary winding. The switch means for the transformer is arranged to be turned on and off in response to the control pulse portions passed by the modulating means. In the preferred form, the control pulse means produces pulses having a voltage which increases at a relatively constant rate during a first portion of each pulse, and a voltage which decreases at a relatively constant rate during a latter portion of the pulse. The modulating means then passes pulse portions which is separated by a voltage level corresponding to amplitude of the signal.

Specifically, the modulating means comprises a differential amplifier which compares voltage of the control pulses to a control voltage corresponding in magnitude to the signal. This produces intermediate control pulse portions which are of a voltage above the control signal voltage. The modulating means utilizes said intermediate control pulse portions to open said switch means for time periods corresponding to the duration of the intermediate control pulse portions.

In the method of the present invention, a series of current pulses are directed through a primary winding of a transformer to cause voltage pulses to be imposed on a secondary winding of the transformer. These voltage pulses are in turn transmitted to power input terminals of an amplifier means. The method further comprises controlling power of the pulses transmitted to the primary winding, in a manner to increase and decrease power of the pulses as the signal increases and decreases in amplitude, in a manner that power delivered to the amplifier means is related to power requirements of the amplifier means to provide an output corresponding to these signals. Preferably, this is done by controlling the duration of the pulses delivered to the primary winding. A control signal is providing by comparing a first value related to amplitude of the signal and a second value related to power then available from the transformer.

It is believed that the other detailed steps of the method of the present invention are readily apparent from an examination of the functions of the apparatus of the present invention.

The signal to be amplified would normally have major amplitude variations which occur in a time period at least as great as a minimum major amplitude change period. For an audio amplifier, this would normally be no less than approximately 1/1000th of a second. Thus, the amplifier apparatus, being arranged to operate within a maximum amplifier voltage level applied at power input terminals of the amplifier itself, should have a minimum response period within which to respond to the major amplitude changes in the signal, in a manner to modify its output in accordance with the amplitude changes.

In this regard, the control means for the apparatus should be such as to generate control pulses at a pulse frequency where each pulse cycle has a duration no greater than the minimum response period, and to transmit these pulses to switch means to turn the switch means "on" and "off" at the pulse frequency to cause current pulses to flow through the primary winding of the transformer. In this manner, the power output of the transformer is adequately responsive to major amplitude variations of the signal.

For an audio amplifier, where major amplitude changes would occur in a time period no less than 1/1000th of a second, the control pulse frequency should be at least on KHz and desirably at least two KHz. In an audio amplifier, there are particular advantages to making the control pulse frequency between fifteen to twenty-five KHz, and desirably about 20 KHz. This level is at a sufficiently high frequency so that any sound that might be generated by virtue of the control pulses would normally be in the very high part or outside of the normal audio range. Further, this frequency would not be so high as to cause problems in the switching means not being adequately responsive.

These and other features of the present invention will become apparent from the following detailed description.

DESCRIPTION OF THE PREFERRED EMBODIMENT

Figure 1:
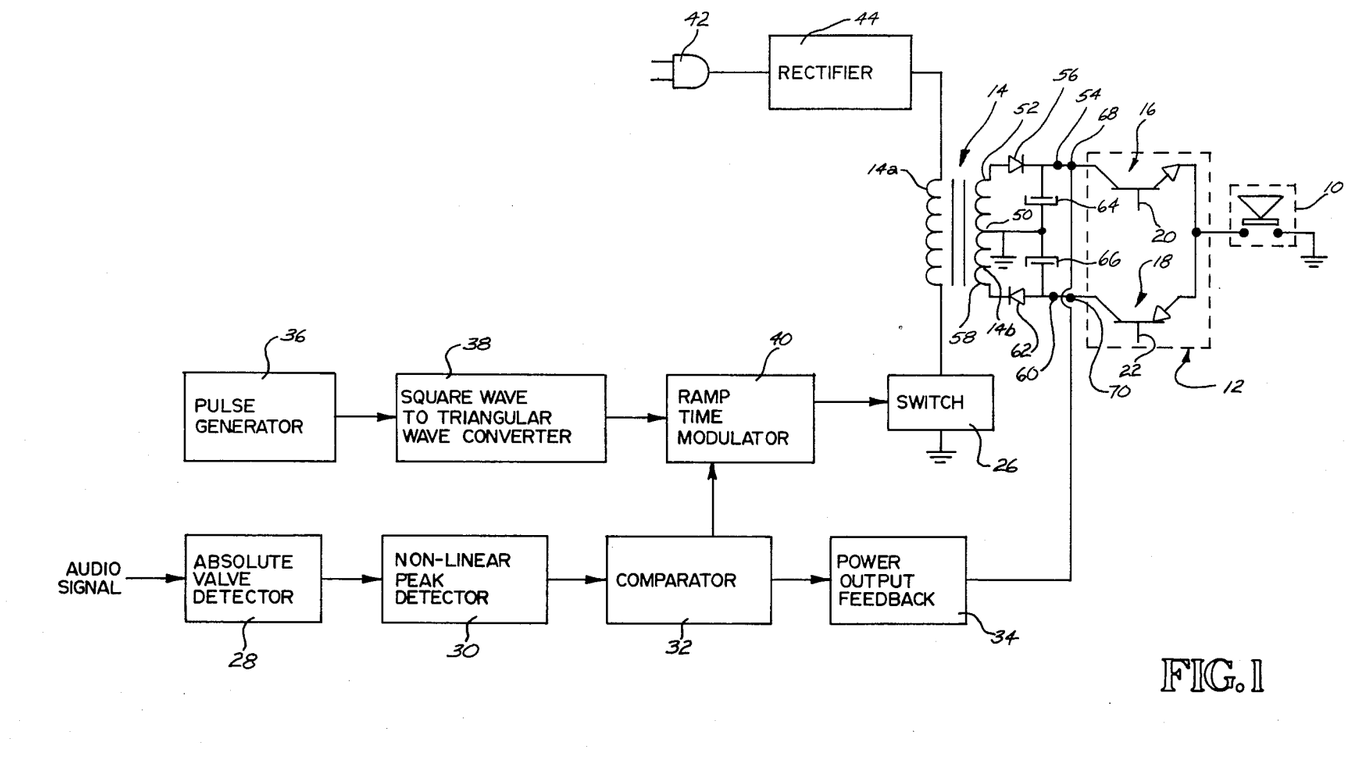
FIG. 1 is a block diagram of the present invention.

Reference is made to FIG. 1 which is a block diagram illustrating the main components of the present invention. There is a speaker 10 which is driven by an amplifier 12, which in turn derives its power from a transformer 14, having primary and secondary windings 14a and 14b, respectively. The speaker 10 and amplifier 12 are or may be of conventional design. As shown herein, the amplifier 12 comprises a pair of transistors 16 and 18 having signal input terminals 20 and 22, respectively, through which the audio signal is fed into the amplifier 12. Positive portions of the audio signal cause the transistor 16 to be conductive while negative portions of the audio signal cause the transistor 18 to be conductive in a manner to supply an output current to the speaker 10 corresponding to the audio signal. In the particular embodiment shown herein, the amplifier 12 is arranged to operate at maximum power output when plus 80 volts is applied to the transistor 16 and minus 80 volts is applied to the transistor 18.

For an appreciation of the significance of the present invention, attention is now directed to the transformer 14. In a conventional power amplifier (e.g. a 400 watt amplifier), the power transformer would weigh at least approximately 20 lbs. The reason for this is as follows. Current flow in the primary winding is equal to the voltage input multiplied by the time the voltage is applied, divided by the inductance of the transformer. For a time varying input voltage, such as a 60Hz, 117 volt house current, analysis reveals that in order to keep the current in the primary winding (i.e. the magnetizing current) within a proper value, the inductance must be made rather large. This requires that a large, heavy transformer be used in a conventional high power amplifier.

In the present invention, a power transformer 14 can be made of a size which is a very small fraction of the size of a transformer of a conventional amplifier of comparable power output. In the particular embodiment described herein, the transformer 14 weighs only about eight ounces or 1/40th of the weight of the transformer of typical prior art amplifiers of the same power rating. The reason for this phenomenal reduction in transformer size is that the present invention permits the inductance of the transformer 14 of the present invention to be made relatively very small. When a voltage is applied across the primary winding 14a of the transformer, the magnetizing current climbs rapidly. Within several microseconds the current will have reached a high value of approximately twenty amps or so, and at this time an electronically controlled switch 26 is opened. At this point in time, an amount of energy is stored in the magnetic field surrounding the primary winding. This stored energy can be considered to be analogous to the energy stored in the electric field of a capacitor. The opening of the switch 26 causes the field to begin collapsing which causes the energy to be transferred to the secondary winding to deliver the energy to the amplifier 12. By turning the switch 26 on and off at a relatively high frequency (i.e. 20KHz), 20,000 voltage pulses are delivered each second to the amplifier 12.

The power delivered by the transformer 14 is controlled by controlling the time within which the switch 26 is open for each current pulse. This is accomplished by tracking the audio signal which is to be amplified by the amplifier 12 and then comparing this tracking signal to the voltage imposed across the amplifier 12. This produces a control signal which is utilized to control the duration of each current pulse delivered to the primary winding of the transformer 14. In other words, on the assumption that the switch 26 is being opened and closed at a frequency of 20 KHz, the duration of each period would be 50 microseconds. During those time periods were the power requirements of the amplifier 12 are high, during each 50 microsecond period, the switch 26 would be open for a relatively large fraction of that time (e.g. 25 to 35 microseconds). When the power requirements of the amplifier 12 are relatively low, the switch 26 would be open in each period for a much shorter duration.

The means by which these ends are accomplished will now be described in more detail with reference to FIG. 1, and also with reference to the various representations contained in FIGS. 2 through 10.

Figure 2:
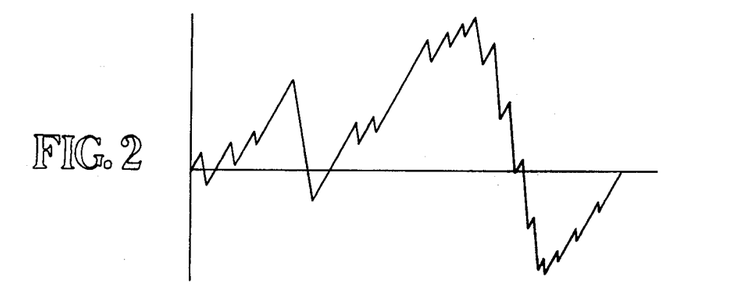
FIG. 2 is a representation of a portion of a typical audio signal which the apparatus of the present invention would amplify.
Figure 3:
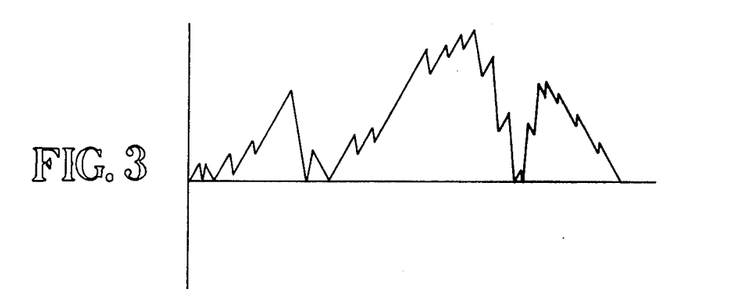
FIG. 3 is a representation of the voltage output producted by the absolute value detector of the apparatus of the present invention.
Figure 4:
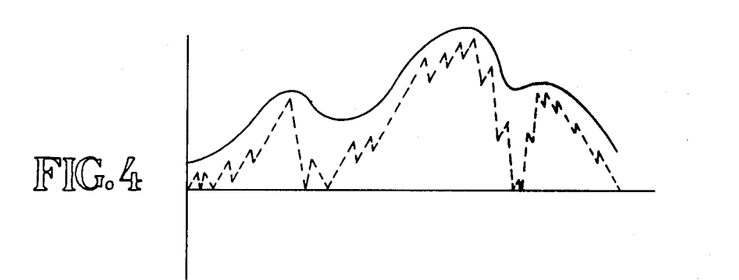
FIG. 4 is a representation of the voltage output of the non-linear peak detector of the present invention.

The audio signal which is to be amplified is directed into an absolute value detector 28. A portion of such an audio signal is illustrated in FIG. 2, and it can be seen that this signal has both positive and negative portions, with the positive portions being represented as being above the horizontal line and the negative portions being represented below the horizontal line of FIG. 2. The absolute value detector 28 provides an output where the negative portions of the audio signal become positive, while maintaining these negative portions at the same magnitude relative to a zero line. The output of the absolute value detector 28 is represented in FIG. 3, and it can be seen that the negative portions of the signal of FIG. 2 have simply been inverted.

The output of the absolute value detector 28 is then directed to a non-linear peak detector 30 which is characterized in that it has a rapid response time for rapidly varying large signals, is less responsive to more slowly varying signals, and virtually unresponsive to small signals varying about any arbitrary average level. The output of the non-linear peak detector is a voltage which is represented approximately in solid lines in FIG. 4, with the output voltage of the absolute value detector 28 being shown in broken lines in FIG. 4.

The output of the non-linear peak detector 30 is fed into a comparator 32. There is also a power output feedback 34 which is responsive to the voltage which is impressed across the power input terminals of the amplifier 12. This power output feedback 34 transmits to the comparator 32 a voltage generally proportional to the voltage at the power input terminals of the amplifier 12. The comparator 32 then "compares" the input from the non-linear peak detector 30 and the input from the power output feedback 34 to produce a control signal generally proportional to the difference between the two inputs.

Figure 5:
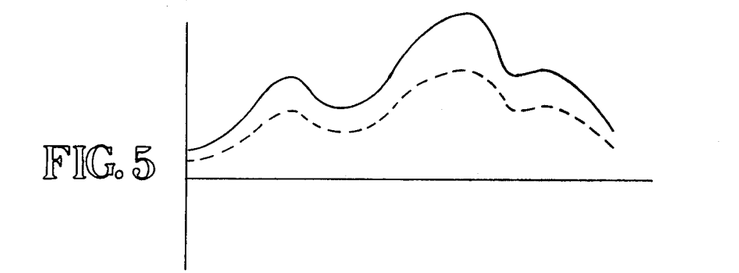
FIG. 5 is a representation of the signal inputs to the comparator of the present invention.
Figure 6:
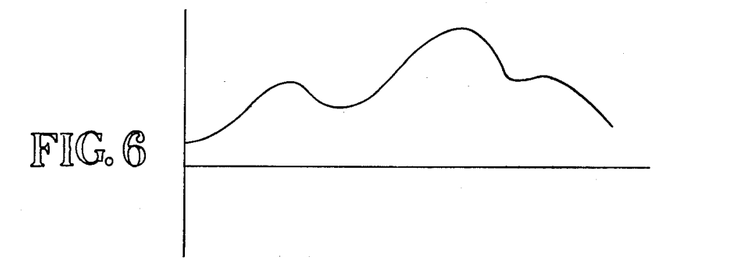
FIG. 6 is a representation of the output signal of the comparator of the present invention.

In FIG. 5, there is illustrated the two inputs to the comparator 32, with the upper solid line representing the input from the non-linear peak detector 30, and the lowr broken line representing the input from the power output feedback 34. It will be noted that there is a relationship between the magnitude of the signal from the non-linear peak detector 30 and the difference between the signal from the non-linear peak detector 30 and the signal from the power output feedback 34, in that the increment of increase in the difference between the two signals increases generally proportionally to the magnitude of the signal from the non-linear peak detector 30. (For purposes of illustration, this difference is exaggerated somewhat in FIG. 5 from what the actual values might be). The control signal which is the output of the comparator 32 is illustrated in FIG. 6. It can be seen that this control signal generally corresponds to the increment of increase or decrease in the difference between the two input signals illustrated in FIG. 5. This control signal is used to control the duration of the regularly timed current pulses in the primary winding 140a of the transformer 14.

Figure 7:
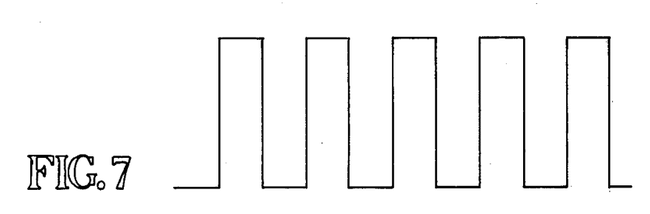
FIG. 7 is a representation of the voltage pulses generated by the pulse generator of the present invention.

There is a pulse generator 36 which functions to generate a pulsed wave of a constant voltage, where the gaps between the pulses are of approximately the same duration as the pulses themselves. The pulses are of a same frequency as the desired current pulses for the transformer 14. In the particular embodiment described herein, where the frequency of the current pulses in the transformer are 20 KHz, the output from the pulse generator 36 would be of the same frequency. The wave form which is the output of the pulse generator 36 is illustrated in FIG. 7.

The output from the pulse generator 36 is directed to a square wave to triangular wave converter 38. This converts the wave form of FIG. 7 to a wave form where each pulse has the configuration of an isosceles triangle, where during the duration of each pulse, the voltage climbs at a substantially constant rate to a peak at the middle of the pulse, and then declines at a constant rate through the latter half of the pulse. This wave form is illustrated in the solid lines of FIG. 8.

Figure 8:
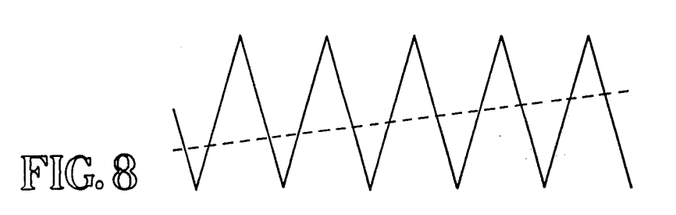
FIG. 8 is a representation of the wave transmitted to the ramp time modulator of the present invention, and the manner in which the signal voltage from the comparator is imposed thereon.

The output from the square waves to triangular wave converter 38 is transmitted to a ramp time modulator 40, and this ramp time modulator 80 also receives the control signal from the comparator 32. The modulator 40 in effect "chops off" the upper portion of the triangular wave form produced by the square wave to triangular wave converter 38. This is illustrated in FIG. 8, by representing a portion of the control signal from the comparator 32 in broken lines superimposed over the triangular wave form which is the output from the converter 38. As shown in FIG. 8, that portion of the control signal is increasing in magnitude. (For purposes of illustration the slope or rate of increase of the control signal may be exaggerated to some extent.)

Figure 9:
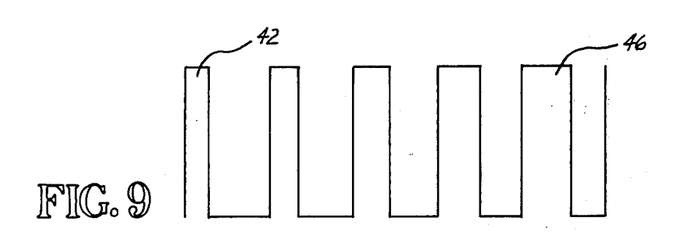
FIG. 9 is a representation of the output of the ramp time modulator resulting from the imposed comparator signal FIG. 7.

The output of the ramp time modulator 40 is illustrated in FIG. 9, and it can be seen to be a constant voltage pulse signal having the same frequency as that of the pulse generator 36. The duration of each pulse is directly proportional to the duration of the "unchopped" bottom portion of the triangular wave form of FIG. 8. Thus, it can be appreciated by comparing the duration of the pulses of FIG. 9 with the slope of the control signal as indicated in the broken lines of FIG. 8, that the duration of the pulses of FIG. 9 are proportional to the magnitude of the control signal as shown in FIG. 8.

Figure 10:
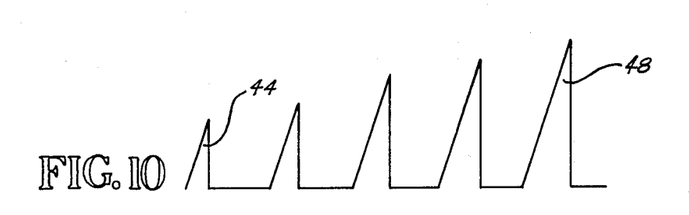
FIG. 10 is a representation of the current pulses transmitted to the power transformer of the present invention.

The pulses of FIG. 9, which are the output of the ramp time modulator 40 are used to open and close the switch 26 in a manner that the switch 26 is open during the duration of each of the pulses of FIG. 9. The manner in which the voltage pulses from the modulator 40 (as represented in FIG. 9) act on the switch 26 to cause the current pulses in the primary winding 14a of the transformer 14 is illustrated in FIG. 10. It can be seen that a pulse of relatively short duration indicated at 42 in FIG. 9 produces a corresponding current pulse 44 of relatively a small magnitude, since the current has such a very short time period to build up or "ramp up". It can be seen that as the voltage pulses of FIG. 9 increase in duration, the magnitude of the current pulses in the transformer primary winding 14a as shown in FIG. 10, increase correspondingly, in a manner that the pulse 46 of longest duration in FIG. 9 produces a current pulse 48 of the largest magnitude of those shown in FIG. 10.

With the foregoing description in mind, let us now relate the operation of the present invention to the amplication of a typical audio signal, such as the audio signal of a musical composition. This signal will be made up of some lower frequency oscillations (fundamental tones) on which are imposed any number of higher frequency oscillations (overtones), with the amplitude of these oscillations varying over a wide range (e.g. from the sound generated by full orchestra to the quiet sound of a single woodwind instrument playing a melodic theme). With regard to the amplitude variations in the signal, although these amplitude variations might seem to the listener to be in some cases very abrupt, in actuality the very sharp amplitude changes of any great magnitude would generally take place in a time period no less than about one thousandths of a second. For example, the rise time associated with the noise generated by a very sharp percussion, such as that generated by slapping two wood blocks together is generally greater than a thousandth of a second.

To describe the operation of the present invention, the apparatus is provided with a conventional plug 42, and let it be assumed that this plug 42 is inserted into a conventional wall socket which provides an alternating current of 110 to 120 volts and 60 cycles per second. Current flows through the plug 42 to a bridge rectifier 44 which converts the alternating current to direct current, with this bridge rectifier in turn being connected to the upper terminal 46 of the transformer primary winding 14a. The lower terminal 48 of the transformer primary winding 14a is connected to the aforementioned switch 26, which in turn is connected to ground. When the switch 26 is conductive, direct current flows through the primary 14a.

The secondary winding 14b of the transformer 14 is center tapped at 50 to ground. The upper terminal 52 of the secondary winding 14b is connected to an upper positive output terminal 54 through a diode 56 which permits only positive current to be directed to the output terminal 54. In a similar manner, the lower terminal 58 of the secondary winding 14b is connected to a lower negative output terminal 60, through a second diode 62 which permits only negative current pulses to be transmitted to the output terminal 60. There are a pair of shunt connected capacitors 64 and 66, one of which is connected to the positive output terminal 54 at a location between that terminal 54 and it's diode 56, and the other capacitor 66 being connected to the negative output terminal 60 at a location between that terminal 60 and it's diode 62. The other plates of the two capacitors 64 and 66 are both connected to ground.

Let it now be assumed that an audio signal is imposed upon the apparatus 10. This signal would be directed into the two input terminals 20 and 22 of the amplifier 12, and would also be directed to the absolute value detector 28. As indicated previously, this audio signal is converted by the absolute value detector 28 to the direct current wave form shown in FIG. 3, which in turn is transmitted to the non-linear peak detector 30 to provide a "smoothed" signal to the comparitor 32.

Since upon initial start up, there is no voltage generated at the output terminals 54 and 60, the feedback signal provided by the power output feedback 34 would be zero or substantially zero. Accordingly, the comparitor 32 would generate a rather strong output signal to the ramp time modulator 40. The ramp time modulator 40 would in turn transmit pulses of the desired frequency to the electronic switch 26, with these pulses being of the maximum duration. In other words, the switch 26 would continue to turn "on" and "off" at the same frequency, but the duration of the "on" periods would be at a maximum. Accordingly, the current pulses passing through the primary winding 14a would ramp up to maximum amperage and thus deliver full power to the output terminals 54 and 60. Within a very short period of time, (i.e. about two hundred microseconds) the voltages applied to the input terminals 68 and 70 of the amplifier 12 would build up to the proper operating level.

At this time, the power output feedback 34, would transmit to the comparitor 32 an output signal related to the voltage level at the input terminals of the amplifier 12. Thereafter, the comparitor 32 would continue to provide to the ramp time modulator 40 a control signal related to the power requirements of the amplifier 12. In other words, when the comparitor 32 receives an input signal from the non-linear peak detector 30 which indicates that the amplitude of the audio signal is increasing, there will be a greater disparity between this audio related signal and the existing signal from the power output feedback 34 so that the strength of the control signal to the ramp time modulator 40 increases. This will in turn cause the current pulses through the primary winding 14a to increase in duration to deliver more power to the amplifier 12 and thus raise the voltages supplied at the output terminals 54 and 60. On the other hand when the amplitude of the audio signal would decline, the comparitor 42 would detect that the difference in the signal from the linear peak detector 30 and that from the power output feedback 34 is smaller, so that the control signal transmitted by the comparitor 32 to the modulator 40 would be of a lower voltage. This would in turn shorten the duration of the current pulses through the primary winding 14a, thus delivering less power to the amplifier 12. From the above description it can readily be appreciated that the comparitor 32 will in effect "track" the audio signal to maintain the voltage impressed upon the power input terminal 68 and 70 of the amplifier 12 so that these voltage levels are varied in such a manner that they remain only moderately above the power requirements of the amplifier 12. In actual practice, there would generally be a voltage drop across each of the transistors 16 and 20 of approximately five volts. In the particular embodiment shown herein, the operating components of the invention are selected so that the maximum voltage which would be applied across the terminal 68 and 70 of the amplifier 12 would be plus 80 volts and minus 80 volts.

As a further advantageous feature of the present invention, attention is directed to the two shunt connected capacitors 64 and 66. Inherent in the operation of the present invention is the feature that at any particular time, a relatively small amount of power need be stored in the two capacitors 64 and 66 to respond to rapid increases in the power requirements of the amplifier 12. The reason for this is that the power pulses through the primary winding 14a are of such a high frequency, and the response time to increase the duration (and thus increase the power) of these current pulses in the transformer 14 can occur in such a very short time, that the transformer 14 can respond in a matter of a fraction of a millisecond to begin delivering full power to the amplifier 12. Thus, these capacitors 64 and 66 can be made with reasonably small capacity, thus creating a further savings in both weight and expense.

Another desirable feature of the present invention is the efficiency achieved. Let it be assumed that the circuit constants have been arranged to cause a constant voltage of five volts across each of the amplifier transistors 16 and 18. Let it further be assumed that the resistance of the load (i.e. the speaker 10) to be eight ohms. Then let us examine three situations:

1. Where the voltage applied to the amplifier 12 is plus 25 and minus 25 volts,

2. Where the applied voltage to the amplifier is plus 35 and minus 35 volts, and 3. Where the applied voltage is plus 45 and minus 45 volts.

The power output is equal to the voltage squared divided by the resistance. For the first situation (where the applied voltage is plus 25 and minus 25 volts), there would be a drop of five volts across each transistor 16 and 18 when each is conducting, and a drop of twenty volts across the eight ohm load. The actual power output would then be twenty squared divided by eight, which gives fifty watts. The loss at the transistors 16 and 18 would be 12½ watts. Therefore out of the total of 62½ watts used (50 watts and 12½ watts) fifty watts are actually utilized in the speaker, for an efficiency of 80%.

In the second situation (where the voltage applied across the amplifier 12 is between plus 35 and minus 35 volts), the power delivered to the speaker would be equal to thirty squared divided by eight for 112 watts. The power dissipated in the transistors 16 and 18 would be 18.75 watts, which gives an efficiency of 85.7%.

In the third situation (where the voltage applied to the amplifier 12 is plus 45 and minus 45 volts), 200 watts are actually utilized in the speaker 10 and only 25 volts dissipated in the transistors 16 and 18, for an efficiency of 88.8%.

In the conventional amplifier where the full voltage of plus 80 volts and minus 80 volts is impressed across the amplifier power input terminals at all times, the efficiencies for the three situations outlined above would be 25%, 37% and 50% respectively. Since the efficiency of the apparatus of the present invention is quite high, a relatively small amount of energy is dissipated in the transistors 16 and 18. For this reason the heat sinks for these transistors 16 and 18 can be made relatively small. It has been found that with these various weight savings a power amplifier can be built according to the present invention, with a power rating of four hundred watts, and with the total apparatus weight only twelve pounds.

Figure 11:
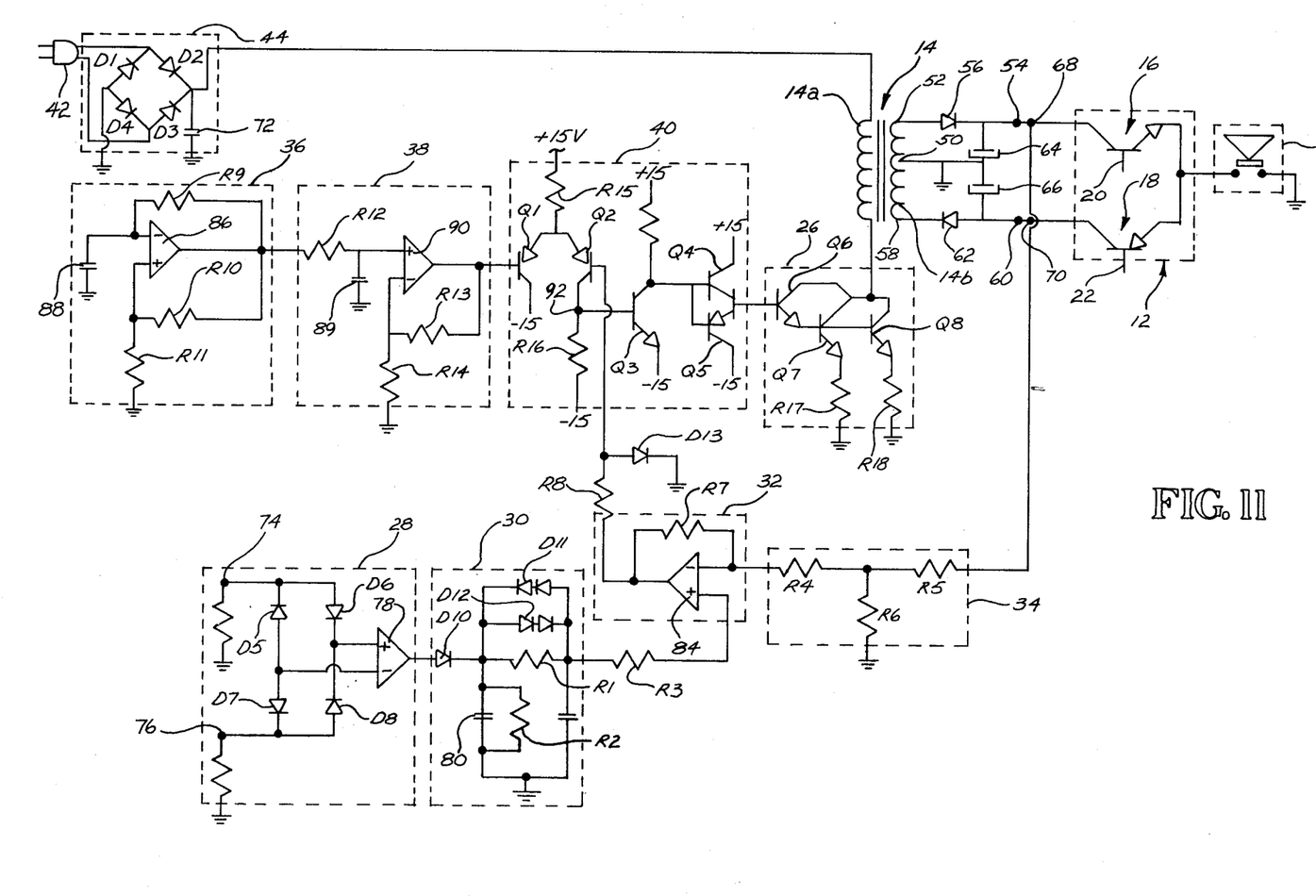
FIG. 11 is a circuit diagram of the apparatus of the present invention.

With reference to FIG. 11, the circuitry of the present invention will now be described in more detail. The plug 42 is adapted to be connected to a conventional wall socket which produces 110 to 120 volts at 60 Hz. The plug 42 connects to the bridge rectifier made up of four diodes D1, D2, D3 and D4 arranged to transmit positive DC current to the primary winding 14a. A small capacitor 72 (fifty to two thousand microfarads) is connected between the output of the bridge rectifier 44 and ground to prevent the DC ouput from the bridge rectifier 44 from going to zero.

The absolute value detector 28 has two input terminals 74 and 76 which are arranged to receive a signal input from a stereo player unit. The signals transmitted to terminal 74 and 76 are in turn transmitted to an operational amplifier 78 through a set of four diodes, D5 D6, D7 and D8. These diodes D5-D8 are so arranged that in the event that there is a quite strong signal at one input 74 or 76 and a relatively weak signal at the other input 74 or 76, the highest value will be transmitted to the operational amplifier 78. The highest negative value will pass through the diodes D5 and D7 while the highest positive value will pass through the diodes D6 and D8. As indicated previously, the output from the operational amplifier 78 is represented in FIG. 3, as an output signal where the negative portions of the audio signal have been made positive.

This signal passes through a diode D10 of the nonlinear peak detector 30. Signals of large value are within the operating envelope of the diodes D11 and D12 and thus are passed immediately with the capacitor 82 providing a more constant output. Smaller signal variations are largely blocked by resistor R1 and diodes D11 and D12.

The output from the non-linear peak detector (represented in the full line of FIG. 4) passes through a resistor R3 to one input terminal of an operational amplifier 84 of the camparitor 32. The input to the other terminal of the operational amplifier is from the power output feedback 34. This component 34 comprises two resistors R4 and R5 connected in series to the positive input terminal 68 of the amplifier 12 and a third resistor R6 connected between ground and a location between the resistors R4 and R5. These resistors R4-R6 step down the voltage from the level at the terminal 68 to less than 15 volts, which is a voltage which the operational amplifier 84 is able to handle. The operational amplifier has a resistor R7 to provide a feedback voltage.

As indicated previously, the output from the operational amplifier 84 is illustrated in FIG. 6, and this is transmitted through a resistor R8 to the ramp time modulator 40. A diode D13 is connected between the location of the resistor R8 and the modulator 40 to pass signals from the amplifier 84 above a certain value to ground.

The pulse generator 36 is or may be provided as one of a number of commercially available pulse generators, such as Fairchild, US 78540. As shown herein, this pulse generator comprises an operational amplifier 86 having a pair of resistors R9 and R10 provided as feedback loops. One input terminal 86 of the operational amplifier is connected to one plate of a capacitor 88, with the other plate of the capacitor 88 being connected to ground. The other terminal of the operational amplifier 86 is connected through a resistor R11 to ground. As indicated previously, the ouput from the pulse generator 36 is represented in FIG. 7.

The square wave to triangular wave converter 38 comprises a resistor R12, which receives the voltage pulses from the generator 36. The resistor R12 is connected to one plate of a capacitor 89, the other plate of which is connected to ground. This capacitor 89 converts the pulsed signal of FIG. 7 to the triangular shaped wave shown in FIG. 8, and this is transmitted through one input terminal of an amplifier 90 which simply amplifies the triangular wave of FIG. 8 and transmits it to the modulator 40. The amplifier 90 has a feedback resistor R13 connected to the other input terminal thereof, and also a resistor R14 connected between the other input terminal and ground.

The ramp time modulator 40 is or may be a differential amplifier of conventional design such as TL0074, Texas Instruments Corp. As shown herein, this modulator 40 comprises two transistors Q1 and Q2 which compare the two voltages directed to the two bases of the transistors Q1 and Q2 and cause that transistor Q1 and Q2 which has the lower input to conduct. The emitters of the two transistors Q1 and Q2 are connected to a positive voltage source through the resistor R15. Thus, for purposes of illustration, let it be assumed that the wave form shown in FIG. 8 is imposed upon the transistor Q1 and the control signal imposed on the transistor Q2 as shown in FIG. 8. In this situation, those portions of the triangular shaped wave which are above the control signal voltage will cause the transistor Q2 to be conductive. The collector of the resistor Q2 is connected through a resistor R16 to a negative voltage terminal, with the resistance of R15 being substantially greater than the resistance of R16. The effect of this is when transistor Q2 is non-conducting, the point 92 located between the transistor Q2 and the resistor R16 goes negative to cause a transistor Q3 to be conductive which in turn causes the transistor Q4 to be conducting and the transistor Q5 to be non-condutive. Thus, the output from the ramp time modulator 40 is a series of pulses, with the duration of each pulse coinciding with the portion of the triangular shaped wave of FIG. 8 which is below the voltage control signal. As indicated previously, this output from the modulator 40 is illustrated in FIG. 9.

The switch 26 comprises a first transistor Q6, the output of which is connected to the bases of two parallel connected transistors Q7 and Q8. Thus, when transistor Q6 becomes conductive, it causes the two transistors Q7 and Q8 to be conductive and cause a current pulse to pass through the primary winding 14a of the transformer 14.

It is believed that the operation of the circuitry of FIG. 11 is readily apparent from the description of the operation which is contained previously herein with reference to the block diagram of FIG. 1. Therefore, this detailed description of the operation will not be repeated at this point.

Figure 12:
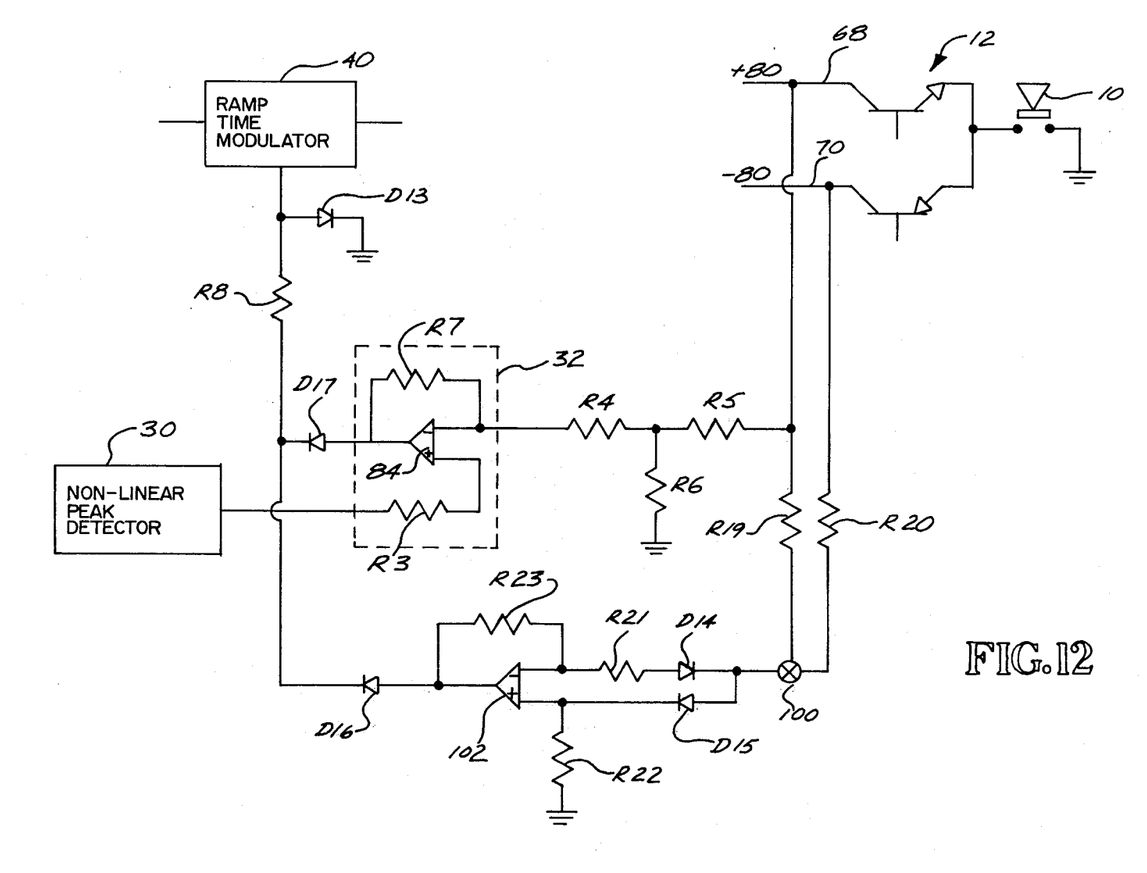
FIG. 12 is a circuit diagram of the power output feedback of the present invention.

A modification of the circuitry of FIG. 11 is shown in FIG. 12. In FIG. 12, there is shown only those portions of the circuitry of FIG. 11 which are necessary for proper orientation of the components shown in FIG. 12 to the other components of the present invention.

The reason for the modification of FIG. 12 is that in some circumstances the voltage at the negative input terminal 70 of the amplifier 12 may have an absolute magnitude that is too low relative to the voltage at the positive terminal 68. In this situation, it would be desirable to override the signal generated by the operational amplifier 84 of the comparator 32 and provide a correction signal of greater magnitude to the ramp time modulator 40. This is accomplished in the circuitry of FIG. 12 in the following manner. The power input terminals 68 and 70 of the amplifier 12 are connected each through a related resistor R19 and R20 to a summing junction 100. The output from the summing junction 100 is a voltage which is the algebraic sum of the voltages at the amplifier input terminals 68 and 70. Thus, if the absolute magnitude of the negative voltage is greater than the absolute magnitude of the plus voltage (minus 40 volts and plus 30 volts), the output at the junction 100 would be a negative value (e.g. minus ten volts). On the contrary, if the positive voltage at the terminal 68 has an absolute magnitude greater than that of the negative voltage at the terinal 70, the output at 100 will be positive.

The summing junction 100 has a first connection through a diode D14 and a resistor R21 to the negative terminal of an operational amplifier 102. The summing junction 100 has a second connection through another diode D15 to the plus terminal of the operational amplifier 102. The diode D14 permits only negative current to pass therethrough, while the diode D15 permits only positive current to pass therethrough. At a location between the diode D15 and the operational amplifier 102, there is a resistor R22 connected to ground. There is also a resistor R23 to provide feedback to the negative terminal of the operational amplifier A3. The output of the operational amplifier 102 leads through a diode D16 which will only pass positive current to the resistor R8. There is also provided a diode D17 which passes positive signals from the operational amplifier A1 to the resistor R8.

When the voltages at the terminals 68 and 70 are equal, the output from the summing junction 100 is zero. In those circumstances where the negative voltage at the terminal 70 is greater than the positive voltage at terminal 68, there would be a negative output from the summing junction 100 which would be transmitted through the diode D14 to the amplifier 102, which would then produce an output signal through the diode D16. If the difference between the voltages at terminal 68 and 70 is sufficiently large, this signal will override the signal from the operational amplifier 84 (which is directed through a diode D17) to cause the ramp time modulator to increase the power of the current pulses and thus correct the difference between the absolute magnitudes of the voltages at terminals 68 and 70.

In those circumstances where the positive voltage at the terminal 68 is higher than the negative voltage at the terminal 70, the output from the summing junction 100 will be positive, and thus transmit a positive voltage through the diode D15 to the amplifier 102. Under these circumstances, the amplifier 102 would also produce an output signal. However, in those circumstances since the voltage at terminal 68 is already relatively high, in most circumstances the signal from the amplifier 84 would be sufficiently large to overcome the signal from the operational amplifier 102, and provide a signal control of sufficient strength to cause the ramp time modulator to increase the duration of the power pulses to the transformer 14 and thus correct the disparity between the absolute magnitude of the voltages at terminal 68 and 70.

As indicated previously herein, when the amplifier of the present invention is operating as an audio amplifier, the major amplitude variations in the signals to be amplified would occur in a time period no less than approximately 1/1000 of a second. Therefore, the apparatus should be able to respond within this time period to change its power output from a low level to a relatively high level within this period of time. For this reason, the frequency of the control pulses, which in turn controls the frequency of the current pulses through the transformer primary winding 14a should be at least a thousand cycles per second, and desirbly at least two thousand cycles per second. However, there are further advantages in operating the current pulses at a much higher frequency, in a range of fifteen and twenty-five thousand cycles per second (desirably about twenty thousand cycles per second). First, this permits the size of the transformer to be made quite small. Also, the frequency is at a sufficiently high level that it would not produce any undesireds sounds in the normal audio range, which is normally below twenty thousand cycles per second. Further, this frequency is not so high as to be beyond the capacity of the switching circuits used.

It is to be understood that the foregoing description discloses the preferred embodiment of the present invention, and various modifications could be made without departing from the broader aspects of the present invention.

What is claimed:

1. An apparatus for amplifying a signal, such as an audio signal, having amplitude variations, said apparatus comprising:
    a. amplifier means having power input means, signal input means, and output means,
    b. power means comprising a transformer having a primary winding and a secondary winding, said secondary winding being operatively connected to the power input means of the amplifier means, said primary winding being adapted to be connected to a voltage source,
    c. means to cause current pulses to be transmitted to the primary winding of the transformer,
    d. circuit means responsive to said signal to control power of the pulses transmitted to the primary winding, in a manner to increase and decrease power of said pulses as said signal increases and decreases in amplitude, in a manner that said power means provides to said amplifier means power of a magnitude related to power requirements of the amplifier means to provide an output corresponding to the signal.

2. The apparatus as recited in claim 1, wherein said circuit means comprises switch means operatively connected to the primary winding to interrupt current to the primary winding, and said circuit means comprises means to make said switch means non-conductive at periodic intervals to cause said current pulses.

3. The apparatus as recited in claim 2, wherein said circuit means comprises modulating means to control the power of the current pulses through the transformer primary winding by controlling the duration of open periods of the switch means in a manner that pulses of shorter duration pass through said primary winding when the amplitude of the signal is relatively small, and pulses of greater duration are delivered through the primary winding of the transformer when the amplitude of the signal is relatively large.

4. The apparatus as recited in claim 1, wherein said circuit means comprises control means to control duration of the pulses transmitted to the primary winding of the transformer in a manner that the pulses of shorter duration are delivered to the primary winding when the amplitude of the signal is relatively small, and pulses of greater duration are delivered when the amplitude of the signal is relatively large.

5. The apparatus as recited in claim 1, wherein said circuit means comprises comparator means responsive to a first value related to amplitude of the signal and to a second value related to power then available from said transformer for the amplifier means, said comparator means arranged to provide a control signal of a value related to a difference between said first and second values to provide an output of a magnitude corresponding generally to the amplitude of the signal.

6. The apparatus as recited in claim 5, wherein said first value is a voltage, the magnitude of which increases and decreases with the amplitude of said signal, and said second value is a voltage related to the voltage at an output end of said transformer.

7. The apparatus as recited in claim 6, further comprising an absolute value detector means arranged to receive said signal and produce a direct current output having a magnitude related to the amplitude of the signal, said absolute value detector means being arranged to transmit said direct current output to the comparator as said first value.

8. The apparatus as recited in claim 7, further comprising non-linear peak detector means arranged to receive said direct current voltage from said absolute value detector means and produce an output voltage for said compatator, with the output voltage of the non-linear peak detector corresponding to the output from the absolute value detector, said non-linear peak detector means being more responsive to large rapid variations in amplitude of the signal and less responsive to relatively small variations in amplitude of the signal.

9. The apparatus as recited in claim 5, wherein:
  a. said comparator means is operatively connected to said transformer to receive a transformer voltage signal related to voltage at one end portion of a secondary winding of the transformer, and also operatively connected to signal input means which provides a signal input voltage related to the amplitude of the signal, said comparator means producing a first control signal related to a difference between said transformer voltage signal and said signal input voltage,
  b. other comparing means operatively connected to one end of the secondary winding of the transformer and also connected to another end of the secondary winding of the transformer to produce a summing value related to a difference in absolute magnitude of voltages at the ends of the transformer secondary winding, said other comparing means being arranged to produce a second control output signal related to said summing value,
  c. said comparator means and said other comparing means arranged to transmit a control output which is responsive to relative magnitude of said first control output signal and said second control output signal, which control output is arranged to control power of current pulses in said primary winding of the transformer.

10. The apparatus as recited in claim 9, wherein the secondary winding of the transformer has a middle portion thereof connected to a reference voltage, in a manner that one end of the secondary winding is positive and the other end of the secondary winding is negative, relative to the reference voltage, said other comparing means being operatively connected to the reference voltage to compare said reference voltage to said summing value to produce said second output control signal.

11. The apparatus as recited in claim 10, wherein said other comparing means comprises an amplifier having two input terminals and an output terminal, a first resistor connected to one end of the said secondary winding and a second resistor connected to the other end of said secondary winding, said first and second resistors being connected at a summing junction, said summing junction being connected through a first diode, which blocks positive current, to one of the input junctions of the amplifier, and also being connected through a second diode, which blocks negative current, to the second input junction of the amplifier, the output terminal of said amplifier being operatively connected to an output from said comparator.

12. The apparatus as recited in claim 1, wherein said circuit means comprises pulsing means to provide control pulses, each having a voltage which varies between a lower and higher level as function of time of each control pulse, and said control circuit means further comprises modulating means to pass portions of said control pulses to control duration of the current pulses through said primary winding.

13. The apparatus as recited in claim 12, further comprising switch means operatively connected to the primary winding of said transformer, and switch control means arranged to turn said switch means on and off in response to the control pulse portions passed by said modulating means.

14. The apparatus as recited in claim 13, wherein said control pulse means produces pulses having a voltage which increases at a relatively constant rate during a first portion of said pulse, and a voltage which decreases at a relatively constant rate during a latter portion of said pulse, said modulating means being arranged to pass pulse portions separated by a voltage level corresponding to amplitude of said signal.

15. The apparatus as recited in claim 14, wherein said circuit means comprises comparator means responsive to a first value related to amplitude of the signal and to a second value related to power then available from said transformer for the amplifier means, said comparator means arranged to provide a control signal of a value related to a difference between said first and second values to provide an output of a magnitude corresponding generally to the amplitude of the signal.

16. The apparatus as recited in claim 12, wherein said circuit means comprises comparator means responsive to a first value related to amplitude of the signal and to a second value related to power then available from said transformer for the amplifier means, said comparator means arranged to provide a control signal of a value related to a difference between said first and second values to provide an output of a magnitude corresponding generally to the amplitude of the signal.

17. The apparatus as recited in claim 12, wherein said modulating means comprises a differential amplifier which compares voltage of said control pulses to a control voltage corresponding in magnitude to amplitude of said signal, and to produce intermediate control pulse portions which are of a voltage above the control signal voltage, said modulating means utilizing said intermediate control pulse portions to open said switch means for time periods corresponding to the duration of said intermediate control pulse portions.

18. The apparatus as recited in claim 1, further comprising:
   a. comparator means responsive to a first value related to amplitude of the signal and to a second value related to power then available from said transformer for the amplifier means, said comparator means arranged to provide a control signal of a value related to a difference between said first and second values to provide an output of a magnitude corresponding generally to the amplitude of the signal,
   b. pulsing means to provide control pulses, each having a voltage which varies between a lower and higher level as function of time of each control pulse,
   c. modulating means to pass the portions of said control pulses to control duration of the current pulses through said primary winding,
   d. switch means operatively connected to the primary winding of said transformer, and switch control means arranged to turn said switch means on and off in response to the control pulse portions passed by said modulating means.

19. The apparatus as recited in claim 18, further comprising:
   a. an absolute value detector means arranged to receive said signal and produce a direct current output having a magnitude related to the amplitude of the signal, said absolute value detector means being arranged to transmit said direct current output to the comparator as said first value,
   b. non-linear peak detector means arranged to receive said direct current voltage from said absolute value detector means and produce an output voltage for said comparator, with the output voltage of the non-linear peak detector corresponding to the output from the absolute value detector, said non-linear peak detector means being more responsive to large rapid variations in amplitude of the signal and less responsive to relatively small variations in amplitude of the signal,
   c. said comparator means being operatively connected to said transformer to receive as said second value a transformer voltage signal related to voltage at one end portion of a secondary winding of the transformer, said comparator means producing as it output a first control signal related to a difference between said transformer voltage signal and said signal input voltage,
   d. other comparing means operatively connected to one end of the secondary winding of the transformer and also connected to another end of the secondary winding of the transformer to produce a summing value related to a difference in absolute magnitude of voltages at the ends of the transformer secondary winding, said other comparing means being arranged to produce a second control output signal related to said summing value,
   e. said comparator means and said other comparing means arranged to transmit a control output which is responsive to relative magnitude of said first control output signal and said second control output signal, which control output is arranged to control power of current pulses in said primary winding of the transformer,
   f. the secondary winding of the transformer has a middle portion thereof connected to a reference voltage, in a manner that one end of the secondary winding is positive and the other end of the secondary winding is negative, relative to the reference voltage, said other comparing means being operatively connected to the reference voltage to compare said reference voltage to said summing value to produce said second output control signal,
   g. said other comparing means further comprising an amplifier having two input terminals and an output terminal, a first resistor connected to one end of said secondary winding and a second resistor connected to the other end of said secondary winding, said first and second resistors being connected at a summing junction, said summing junction being connected through a first diode, which blocks positive current, to one of the input junctions of the amplifier, and also being connected through a second diode, which blocks negative current, to the second input junction of the amplifier, the output terminal of said amplifier being operatively connected to an output from said comparator.

20. A method of amplifying a signal, such as an audio signal, said method comprising:
   a. directing a series of current pulses through a primary winding of a transformer to cause voltage pulses to be imposed on a secondary winding of the transformer,
   b. converting and transmitting said voltage pulses into a time varying D.C. voltage to supply power to the input terminals of an amplifier means which is responsive to said signal so as to amplify said signal,
   c. controlling power of the pulses transmitted to the primary winding, in a manner to increase and decrease power of said pulses as said signal increases and decreases in amplitude, in a manner that power delivered to the amplifier means is related to power requirement of the amplifier means to provide an output corresponding to the signal.

21. The method as recited in claim 20, wherein the power of the current pulses through said primary winding is controlled by operating switch means to interrupt current to the primary winding in a manner that pulses of shorter duration pass through the primary winding when the amplitude of the signal is relatively small, and pulses of greater duration are delivered through the primary winding of the transformer when the amplitude of the signal is relatively large.

22. The method as recited in claim 21, wherein there is provided a first value related to amplitude of the signal and a second value related to power then available from said transformer for said amplifier means, said method further comprising comparing said first and second values to produce a control signal of a value related to a difference between said first and second values and utilizing said control signal to control power of said current pulses through said transformer.

23. The method as recited in claim 22, further comprising providing said first value as a voltage, the magnitude of which increases and decreases with the amplitude of said signal, and providing said second value as a voltage related to voltage at an output of the transformer.

24. The method as recited in claim 23, further comprising providing said first value by directing said signal through an absolute value detector means to produce a direct current output having a magnitude related to the amplitude of the signal, and then transmitting said direct current output as said first value to be compared to said second value.

25. The method as recited in claim 24, further comprising directing the direct current output from the absolute value detector through a non-linear peak detector to produce an output voltage to be compared to said second value, with the output voltage of the non-linear peak detector corresponding to the output from the absolute value detector, in a manner that the output of the non-linear peak detector is more responsive to large rapid variations in amplitude of the signal and less responsive to relatively small variations in amplitude of the signal.

26. The method as recited in claim 20, further comprising:
   a. producing a first control signal as follows:
      1. providing a transformer voltage signal related to voltage at one end portion of the secondary winding of the transformer,
      2. producing a signal input voltage related to the amplitude of the signal,
      3. comparing said transformer voltage signal and said signal input voltage to produce a first control output signal related to a difference between said transformer voltage signal and said signal input voltage,
   b. producing a summing value from output ends of said transformer as follows:
      1. producing a summing voltage related to a difference in absolute magnitude of voltages at first and second ends of the secondary winding of the transformer,
      2. producing a second control output signal related to magnitude of said summing value,
   c. selecting the greater of said control output signals to control power of current pulses in the primary winding of the transformer.

27. The method as recited in claim 26, wherein said summing value is provided by connecting a middle portion of the secondary winding of the transformer to a reference voltage in a manner that one end of the secondary winding is positive and the other end of the secondary winding is negative, relative to the reference voltage, then comparing the summing value to the reference voltage to produce said second control output signal.

28. The method as recited in claim 27, wherein said second output control signal is provided by directing current from one end of the secondary winding of the transformer through a resistor to a summing junction, and directing current from the other end of the secondary winding through a second resistor to said summing junction to provide a summing voltage, directing said summing voltage either through a first diode, which blocks positive current, to one input junction of an amplifier, or through a second diode which blocks negative current to a second input junction of an amplifier, and producing from said amplifier said second output control signal.

29. The method as recited in claim 20, further comprising providing a series of control pulses, each of which has voltage which varies between a lower and higher level as a function of time of each control pulse, modulating said control pulses to pass portions of said control pulses to control duration of the current pulses through said primary winding.

30. The method as recited in claim 29, further comprising operating switch means operatively connected to the primary winding of the transformer, in a manner to turn said switch means on and off in response to the control pulse portions received from said modulating means, so as to control power of current pulses in said primary winding.

31. The method as recited in claim 30, further comprising producing control pulses that have a voltage which increases at a relatively constant rate during a first portion of each pulse, and which decreases at a relatively constant rate during a latter portion of said pulse, and modulating said pulses by passing pulse portions separated by a voltage level corresponding to amplitude of said signal.

32. The method as recited in claim 31, further comprising producing a first value related to amplitude of the signal and producing a second value related to power then available from the transformer for the amplifier means, comparing said first and second values to provide a control signal of a value related to a difference between said first and second values and utilizing said control signal to pass said pulse portions that are separated by a voltage level corresponding to the amplitude of the signal.

33. The method as recited in claim 29, further comprising producing a first value related to amplitude of the signal, and producing a second value related to power then available from the transformer for the amplifier means, comparing said first and second values to provide a control signal of a value related to a difference between said first and second values to provide an output of a magnitude corresponding generally to the amplitude of said signal, and utilizing said output to modulate said control pulses to control the duration of the current pulses through the primary winding.

34. The method as recited in claim 20, wherein:
   a. the power of the current pulses through said primary winding is controlled by operating switch means to interrupt current to the primary winding in a manner that pulses of shorter duration pass through the primary winding when the amplitude of the signal is relatively small, and pulses of greater duration are delivered through the primary winding of the transformer when the amplitude of the signal is relatively large,
   b. there is provided a first value related to amplitude of the signal and a second value related to power then available from said transformer for said amplifier means, said method further comprising comparing said first and second values to produce a control signal of a value related to a difference between said first and second values,
   c. providing a series of control pulses, each of which has voltage which varies between a lower and higher level function of time of each control pulse,
   d. modulating said control pulses by means of said control signal to pass portions of said control pulses to control duration of the current pulses through said primary winding.

35. The method as recited in claim 34,
   a. further comprising providing said first value by directing said signal through an absolute value detector means to produce a direct current output having a magnitude related to the amplitude of the signal, b. further comprising directing the direct current output from the absolute value detector through a non-linear peak detector to produce an output voltage to be compared to said second value, with the output voltage of the non-linear peak detector corresponding to the output from the absolute value detector, in a manner that the output of the non-linear peak detector is more responsive to large rapid variations in amplitude of the signal and less responsive to relatively small variations in amplitude of the signal, c. producing a first control signal as follows:
   1. providing a transformer voltage signal related to voltage at one end portion of the secondary winding of the transformer,
   2. producing a signal input voltage related to the amplitude of the signal,
   3. comparing said transformer voltage signal and said signal input voltage to produce a first control output signal related to a difference between said transformer voltage signal and said signal input voltage, d. producing a summing value from output ends of said transformer as follows:
   1. producing a summing voltage related to a difference in absolute magnitude of voltages at first and second ends of the secondary winding of the transformer,
   2. producing a second control output signal related to magnitude of said summing value, e. selecting the greater of said control output signals to control power of current pulses in the primary winding of the transformer, f. providing said summing value by connecting a middle portion of the secondary winding of the transformer to a reference voltage in a manner that one end of the secondary winding is negative, relative to the reference voltage, then comparing the summing value to the reference voltage to produce said second control output signal, g. providing said second output control signal by directing current from one end of the secondary winding of the transformer through a resistor to a summing junction, and directing current from the other end of the secondary winding through a second resistor to said summing junction to provide a summing voltage, directing said summing voltage either through a first diode, which blocks positive current, to one input junction of an amplifier, or through a second diode which blocks negative current to a second input junction of an amplifier, and producing from said amplifier said second output control signal.

36. An apparatus to deliver power to an amplifier which amplifies a signal, such as an audio signal, said apparatus comprising:
   a. a power transformer having a primary winding and a secondary winding, said primary winding being adapted to have a DC voltage applied thereto,
   b. switch means operatively connected to said primary winding and having a first mode to cause current to flow through said primary winding and a second mode to interrupt current to said primary winding,
   c. said secondary winding having a positive output terminal and a negative output terminal adapted to be connected to power input terminals of an amplifier,
   d. means to generate control pulses, each having a voltage which changes at a predetermined rate during duration of said pulses,
   e. comparator means,
   f. signal input means responsive to said signal to provide for said comparator a first signal value corresponding to amplitude of said signal,
   g. power feedback means responsive to power available at said transformer to provide said comparator with a second value corresponding to power available at said transformer,
   h. said comparator being arranged to produce a pulse control signal corresponding to a difference of said first and second values,
   i. modulating means arranged to modulate said control pulses in accordance with said pulse control signal to provide switch control pulses having durations corresponding to said pulse control signal,
   j. said switch means being responsive to said switch control pulses in a manner that the switch control pulses cause said switch means to go between its first and second modes to cause current pulses in said primary winding, with said current pulses having durations corresponding to durations of said switch control pulses, whereby the power delivered by said apparatus increases and decreases with corresponding increases and decreases in amplitude of said signal.

37. The apparatus as recited in claim 36, wherein said first value is a voltage, the magnitude of which increases and decreases with the amplitude of said signal, and said second value is a voltage related to the voltage at an output end of the transformer.

38. The apparatus as recited in claim 37, further comprising an absolute value detector means arranged to receive said signal and produce a direct current output having a magnitude related to the amplitude of the signal, said absolute value detector means being arranged to transmit said direct current output to the comparator as said first value.

39. The apparatus as recited in claim 38, further comprising non-linear peak detector means arranged to receive said direct current voltage from said absolute value detector means and produce an output voltage for said comparator means, with the output voltage of the non-linear peak detector corresponding to the output from the absolute value detector, said non-linear peak detector means being more responsive to large rapid variations in amplitude of the signal and less responsive to relatively small variations in amplitude of the signal.

40. The apparatus as recited in claim 36, wherein:
   a. said comparator means in operatively connected to said transformer to receive a transformer voltage signal related to voltage at one end portion of a secondary winding of the transformer, and also operatively connected to signal input means which provides a signal voltage related to the amplitude of the signal, said comparator means producing a first control signal related to a difference between said transformer voltage signal and said signal input voltage,
   b. other comparing means operatively connected to one end of the secondary winding of the transformer and also connected to another end of the secondary winding of the transformer to produce a summing value related to a difference in absolute magnitude of voltages at the ends of the transformer secondary winding, said other comparing means being arranged to produce a second control output signal related to said summing value, c. said comparator means and said other comparing means arranged to transmit a control output which is responsive to relative magnitude of said first control output signal and said second control output signal, which control output is arranged to control power of current pulses in said primary winding of the transformer.

41. The apparatus as recited in claim 40, wherein the secondary winding of the transformer has a middle portion thereof connected to a reference voltage, in a manner that one end of the secondary winding is positive and the other end of the secondary winding is negative, relative to the reference voltage, said other comparing means being operatively connected to the reference voltage to compare said reference voltage to said summing value to produce said second output control signal.

42. The apparatus as recited in claim 41, wherein said other comparing means comprises an amplifier having two input terminals and an output terminal, a first resistor connected to one end of the said secondary winding and a second resistor connected to the other end of said secondary winding, said first and second resistors being connected at a summing junction, said summing junction being connected through a first diode, which blocks positive current, to one of the input junctions of the amplifier, and also being connected through a second diode, which blocks negative current, to the second input junction of the amplifier, the output terminal of said amplifier being operatively connected to an output from said comparator.

43. The apparatus as recited in claim 36, wherein said control pulse means produces pulses having a voltage which increase at a relatively constant rate during a first portion of said pulse, and a voltage which decreases at a relatively constant rate during a latter portion of said pulse, said modulating means being arranged to pass pulse portions separated by a voltage level corresponding to amplitude of said signal.

44. The apparatus as recited in claim 36, wherein said modulating means comprises a differential amplifier which compares voltage of said control pulses to a control voltage corresponding in magnitude to amplitude of said signal, and to produce intermediate control pulse portions which are of a voltage above the control signal voltage, said modulating means utilizing said intermediate control pulse portions to open said switch means for time periods corresponding to the duration of said intermediate control pulse portions.

45. The apparatus as recited in claim 36, further comprising:

a. an absolute value detector means arranged to receive said signal and produce a direct current output having a magnitude related to the amplitude of the signal, said absolute value detector means being arranged to transmit said direct current output to the comparator as said first value, b. non-linear peak detector means arranged to receive said value detector means and produce an output voltage for said comparator, with the output voltage of the non-linear peak detector corresponding to the output from the absolute value detector, said non-linear peak detector means being more responsive to large rapid variations in amplitude of the signal and less responsive to relatively small variations in amplitude of the signal, c. said comparator means being operatively connected to said transformer to receive as said second value a transformer voltage signal related to voltage at one end portion of a secondary winding of the transformer, said comparator means producting as it output a first control signal related to a difference between said transformer voltage signal and said signal input voltage, d. other comparing means operatively connected to one end of the secondary winding of the transformer and also connected to another end of the secondary winding of the transformer to produce a summing value related to a difference in absolute magnitude of voltages at the ends of the transformer secondary winding, said other comparing means being arranged to produce a second control output signal related to said summing value, e. said comparator means and said other comparing means arranged to transmit a control output which is responsive to relative magnitude of said first control output signal and said second control output signal, which control output is arranged to control power of current pulses in said primary winding of the transformer, f. the secondary winding of the transformer has a middle portion thereof connected to a reference voltage, in a manner that one end of the secondary winding is positive and the other end of the secondary winding is negative, relative to the reference voltage, said other comparing means being operatively connected to the reference voltage to compare said reference voltage to said summing value to produce said second output control signal, g. said other comparing means further comprising an amplifier having two input terminals and an output terminal, a first resistor connected to one end of said secondary winding and a second resistor connected to the other end of said secondary winding, said first and second resistors being connected at a summing junction, said summing junction being connected through a first diode, which blocks positive current, to one of the input junctions of the amplifier, and also being connected through a second diode, which blocks negative current, to the second input junction of the amplifier, the output terminal of said amplifier being operatively connected to an output from said comparator.

46. An apparatus to provide power for an amplifier, which amplifies a signal, such as an audio signal, said signal having major amplitude variatons which occur in a time period at least as great as a minimum major amplitude change period, said amplifier being arranged to operate within a maximum amplifier voltage level applied at power input terminals of said amplifier said amplifier further having a minimum response period within which to respond to said major amplitude changes in the signal, in a manner to modify its output in accordance with said amplitude changes, said apparatus comprising:

a. a primary transformer, having a primary winding adapted to operate with an input voltage within a predetermined input voltage range and a secondary winding adapted to produce an output voltage within a predetermined output voltage range having a maximum value corresponding generally to said maximum amplifier voltage level, b. switch means operatively connected to said primary winding, said switch means having an "on" position where current flows through said primary winding, and an "off" position where current through said primary winding is interrupted,
c. means to generate control pulses at a pulse frequency where each pulse cycle has a duration no greater than said minimum response period, and to transmit said pulses to said switch means to turn said switch means "on" and "off" at said pulse frequency to cause current pulses to flow through said primary winding,
d. control means, including means responsive to said signal, to increase and decrease duration of said control pulses to change duration of said control pulses in accordance with changes in amplitude of said signal, wherein said transformer delivers greater power during time periods where the signal has greater amplitude, and less power during time periods where the signal has less amplitude.

47. The apparatus as recited in claim 46, wherein said pulse frequency is no less than about one KHz.

48. The apparatus as recited in claim 46, wherein said pulse frequency is no less than about two KHz.

49. The apparatus as recited in claim 46, wherein said pulse frequency is between about 15 KHz to 25 KHz.

50. The apparatus as recited in claim 49, wherein said pulse frequency is approximately 20 KHz.

* * * * *